(12) United States Patent
Kang et al.

(10) Patent No.: US 7,602,658 B2
(45) Date of Patent: *Oct. 13, 2009

(54) RFID DEVICE HAVING NONVOLATILE FERROELECTRIC MEMORY DEVICE

(75) Inventors: Hee Bok Kang, Daejeongwangyeok-si (KR); Jin Hong Ahn, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/045,636

(22) Filed: Mar. 10, 2008

(65) Prior Publication Data

US 2008/0159021 A1  Jul. 3, 2008

Related U.S. Application Data

(63) Continuation of application No. 11/320,986, filed on Dec. 30, 2005, now Pat. No. 7,366,039.

(30) Foreign Application Priority Data

May 30, 2005  (KR) ...................... 10-2005-0045484

(51) Int. Cl.
    *G11C 7/00* (2006.01)
(52) U.S. Cl. ........................ 365/192; 365/145; 365/149; 365/189.09
(58) Field of Classification Search ................. 365/192, 365/145, 149, 189.09
    See application file for complete search history.

(56) References Cited

U.S. PATENT DOCUMENTS

| 4,873,664 | A | 10/1989 | Eaton, Jr. | |
|---|---|---|---|---|
| 5,018,105 | A * | 5/1991 | Miyanishi | 365/203 |
| 5,715,190 | A * | 2/1998 | Honjo et al. | 365/149 |
| 5,926,110 | A | 7/1999 | Downs et al. | |
| 6,646,905 | B2 | 11/2003 | Tada | |
| 6,671,200 | B2 * | 12/2003 | Ogiwara et al. | 365/145 |
| 6,804,140 | B2 | 10/2004 | Lin et al. | |
| 6,809,952 | B2 * | 10/2004 | Masui | 365/145 |
| 6,819,601 | B2 | 11/2004 | Eliason et al. | |
| 6,829,154 | B1 | 12/2004 | Kang | |
| 6,853,575 | B2 | 2/2005 | Kang | |
| 7,158,408 | B2 | 1/2007 | Roesner et al. | |
| 2001/0027532 | A1 | 10/2001 | Hoshino et al. | |
| 2003/0214831 | A1 | 11/2003 | Kang | |
| 2005/0052895 | A1 | 3/2005 | Kang | |
| 2006/0151616 | A1 | 7/2006 | Sheats | |

FOREIGN PATENT DOCUMENTS

| JP | 2001-222883 | 8/2001 |
|---|---|---|
| JP | 2003-076953 A | 3/2003 |
| JP | 2005-004779 A | 1/2005 |

* cited by examiner

*Primary Examiner*—Connie C Yoha
(74) *Attorney, Agent, or Firm*—Townsend and Townsend and Crew LLP (57) ABSTRACT

A RFID device having a nonvolatile ferroelectric memory regulates bit line capacitance to optimize a bit line sensing margin and minimize power consumption. The RFID device having an analog block adapted and configured to transmit and receive a radio frequency signal to/from an external communication apparatus, a digital block adapted and configured to receive a power voltage and the radio frequency signal from the analog block, transmit a response signal to the analog block and output a memory control signal, and a memory adapted and configured to store data and regulate bit line capacitance.

9 Claims, 7 Drawing Sheets

RFID DEVICE HAVING NONVOLATILE FERROELECTRIC MEMORY DEVICE

BACKGROUND OF THE INVENTION

1. Field of the Invention

The present invention generally relates to a RFID device having a nonvolatile ferroelectric memory, and more specifically, to a technology of regulating bit line capacitance to optimize a bit line sensing margin and to minimize power consumption.

2. Description of the Related Art

Generally, a ferroelectric random access memory (hereinafter, referred to as 'FeRAM') has attracted considerable attention as next generation memory device because it has a data processing speed as fast as a Dynamic Random Access Memory (hereinafter, referred to as 'DRAM') and preserves data even after the power is turned off.

The FeRAM having structures similar to the DRAM includes the capacitors made of a ferroelectric substance, so that it utilizes the high residual polarization characteristic of the ferroelectric substance in which data is not deleted even after an electric field is eliminated.

A common RFID device having a nonvolatile ferroelectric memory consumes a large amount of power resulting in a decrease of available power voltage.

At a read mode, the optimum sensing voltage margin is required to perform sufficient charge distribution between a cell capacitor and a bit line in the nonvolatile ferroelectric memory.

Since the nonvolatile ferroelectric memory uses a hysteresis loop, the sensing voltage margin becomes smaller and unable to perform a normal operation when the bit line capacitance is too small or too large.

That is, when the bit line capacitance is too small, a sufficient destructive operation cannot be performed in the charge distribution between the cell capacitor and the bit line.

Meanwhile, when the bit line capacitance is too large, the destructive operation is sufficiently performed in the charge distribution between the cell capacitor and the bit line. However, a development voltage is too small to perform a normal amplification operation.

As described above, since unit cells connected to a plurality of word lines are connected to one bit line, the intrinsic capacitance of the bit line is smaller than that of the cell capacitor. As a result, it is impossible to secure the optimum sensing voltage margin to the bit line in the charge distribution between the cell capacitor and the bit line.

SUMMARY OF THE INVENTION

Accordingly, it is an object of the present invention to regulate bit line capacitance in charge distribution between a cell capacitor and a bit line to optimize a sensing voltage margin.

It is another object of the present invention to regulate bit line capacitance in charge distribution between a cell capacitor and a bit line to minimize power consumption.

According to an embodiment of the present invention, a RFID device having a memory comprises an analog block adapted and configured to transmit and receive a radio frequency signal to/from an external communication apparatus, a digital block adapted and configured to receive a power voltage and a radio frequency signal from the analog block, transmit a response signal to the analog block and output a memory control signal, and a memory including a bit line capacitance matching unit adapted and configured to regulate capacitance of a bit line and a cell array block comprising a plurality of unit cells for storing the data.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 1:
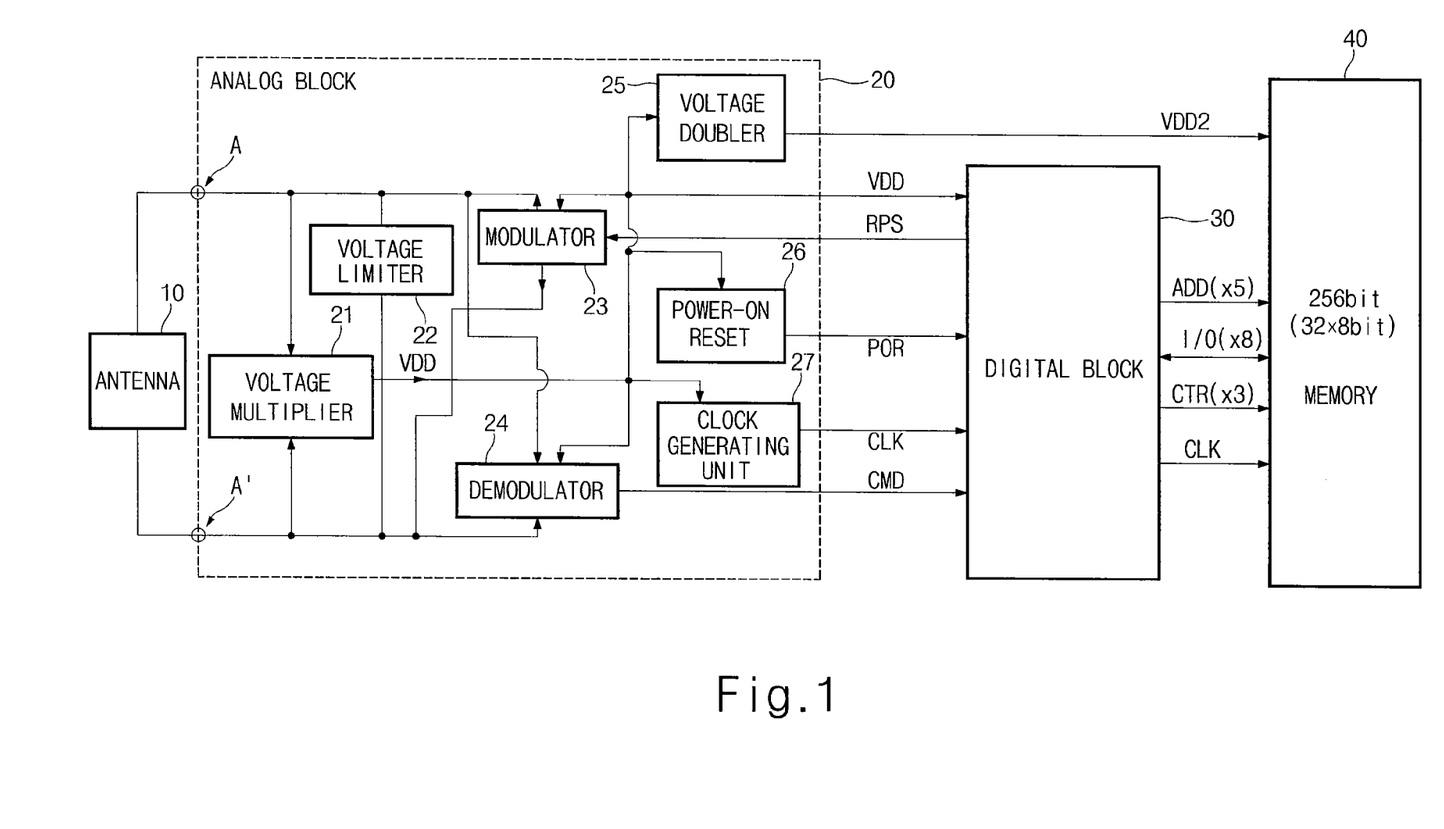
FIG. 1 is a block diagram illustrating a RFID device having a nonvolatile ferroelectric memory according to an embodiment of the preset invention.

FIG. 1 is a block diagram illustrating a RFID device having a nonvolatile ferroelectric memory according to an embodiment of the preset invention. In this embodiment, the RFID device comprises an antenna 10, an analog block 20, a digital block 30 and a memory 40.

The antenna 10 transmits and receives data to/from an external reader or writer in response to a radio frequency signal.

The analog block 20 comprises a voltage multiplier 21, a voltage limiter 22, a modulator 23, a demodulator 24, a voltage doubler 25, a power-on reset unit 26 and a clock generating unit 27.

The voltage multiplier 21 generates a power voltage VDD of the RFID device in response to the radio frequency signal applied from the antenna 10.

The voltage limiter 22 limits a voltage of the radio frequency signal applied from the antenna 10.

The modulator 23 modulates a response signal RPS applied from the digital block 30 to transmit the signal to the antenna 10.

The demodulator 24 detects an operation command signal in the radio frequency signal applied from the antenna 10 by the power voltage VDD to output a command signal CMD to the digital block 30.

The voltage doubler 25 boosts the power voltage VDD applied from the voltage multiplier 21 to supply a boosting voltage VDD2 having a swing width twice larger than that of the power voltage VDD.

The power-on reset unit 26 senses the power voltage VDD applied from the voltage multiplier 21 to output a power-on reset signal POR for controlling a reset operation to the digital block 30.

The clock generating unit 27 generates a clock signal CLK by the power voltage VDD.

The digital block 30 receives the power voltage VDD, the power-on reset signal POR, the clock signal CLK and the command signal CMD from the analog block 20, and outputs a response signal RPS to the analog block 20. The digital block 30 outputs an address ADD, data I/O, a control signal CTR and a clock signal CLK to the memory 40.

The memory 40 comprises a plurality of unit memory cells each including a nonvolatile ferroelectric capacitor.

Figure 2:
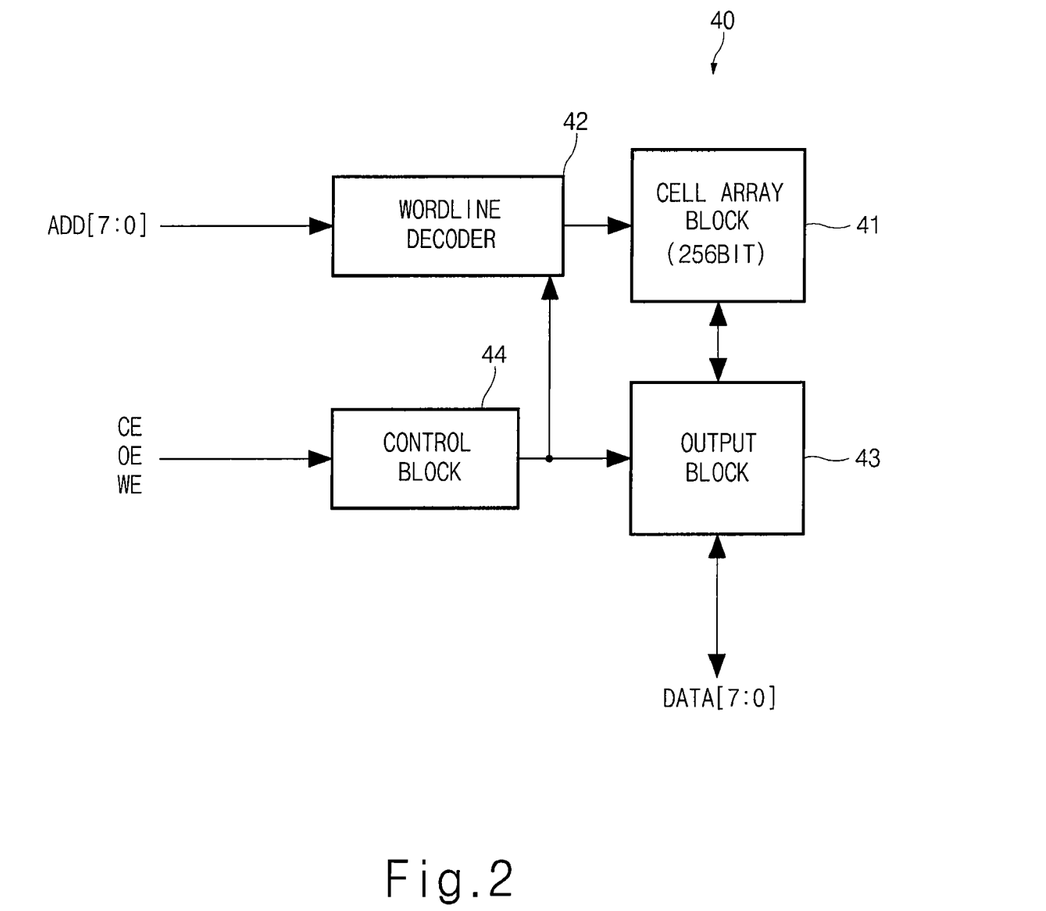
FIG. 2 is a block diagram illustrating a memory of FIG. 1.

FIG. 2 is a block diagram illustrating the memory 40 of FIG. 1.

The memory 40 comprises a cell array block 41, a word line decoder 42, a control block 43 and an output block 44.

The cell array block 41 comprises a plurality of unit memory cells.

The word line decoder 42 decodes an address ADD[7:0] to select a word line corresponding to the cell array block 41.

The output block 43 senses and amplifies data on a selected bit line to output the data, or transmits externally inputted data to the cell array block 41.

The control block 44 receives a chip enable signal CE, an output enable signal OE and a write enable signal WE to output a control signal for read/write operations to the word line decoder 42 and the output block 43.

Figure 3:
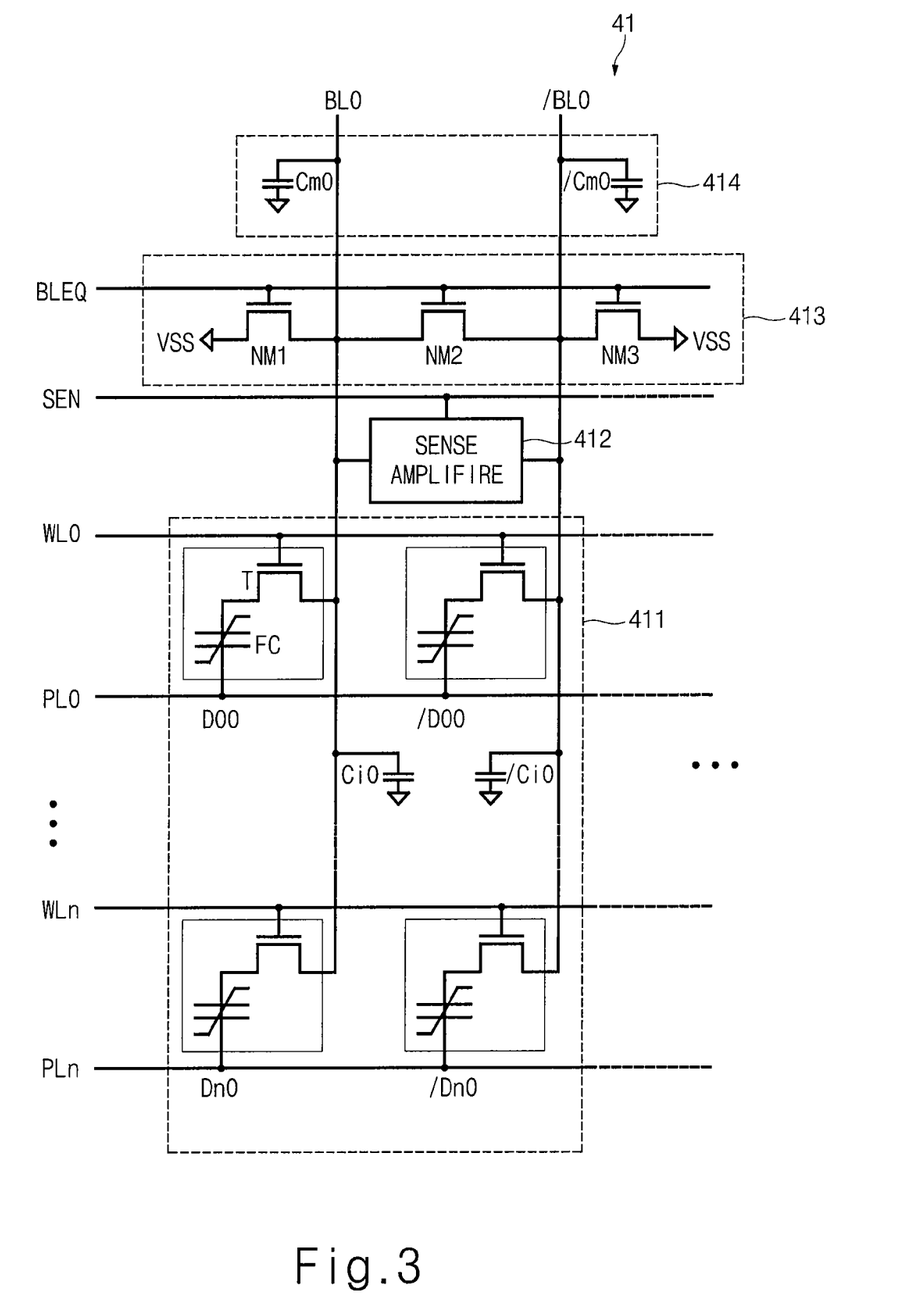
FIG. 3 is a circuit diagram illustrating a cell array block of FIG. 2.

FIG. 3 is a circuit diagram illustrating the cell array block 41 of FIG. 2.

The cell array block 41 comprises a memory cell array 411, a sense amplifier 412, a bit line equalization unit 413 and a bit line capacitance matching unit 414.

The memory cell array 411 comprises a plurality of memory cells D0_0, /D0_0~Dn_0, /Dn_0 selected by paired bit lines BL0 and /BL0, word lines WL0~WLn and plate lines PL0~PLn. Each of the unit memory cells D00, /D00~Dn0, /Dn0 comprises a ferroelectric capacitor FC and a cell transistor T which is controlled by a voltage applied to the word lines WL0~WLn.

The sense amplifier 414 amplifies data on the bit line BL0 depending on a voltage difference of the paired bit lines BL0 and /BL0 in response to a sense amplifier enable signal SEN.

The bit line equalization unit 413 comprises NMOS transistors NM1 and NM3 that connect the paired bit lines BL0 and /BL0 to each ground voltage in response to a bit line equalization signal BLEQ, and a NMOS transistor NM2 that equalizes the paired bit lines BL0 and /BL0 in response to the bit line equalization signal BLEQ.

The bit line capacitance matching unit 414 comprises a plurality of matching capacitors Cm0, /Cm0 each connected between the paired bit lines BL0, /BL0 and the ground voltage.

The total bit line capacitance CBL of the paired bit lines BL0, /BL0 is addition of bit line intrinsic capacitors Ci0, /Ci0 and matching capacitors Cm0, /Cm0.

As a result, a sensing voltage margin can be optimized by increasing capacitance of the bit line capacitance CBL by adding the matching capacitors Cm0, /Cm0 of FIG. 3 at a read mode.

Figure 4:
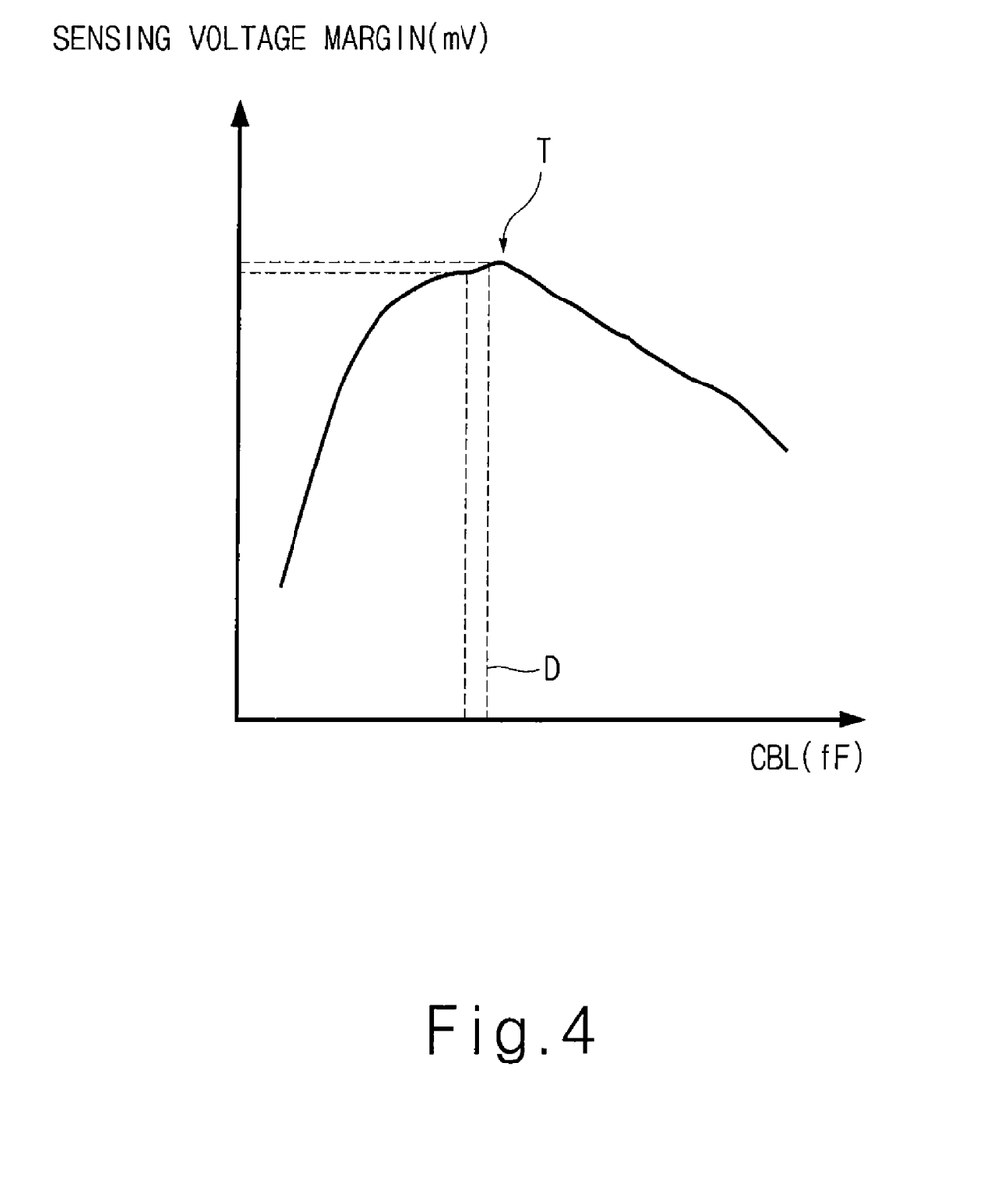
FIG. 4 is a graph illustrating a sensing voltage margin to bit line capacitance.

FIG. 4 is a graph illustrating a sensing voltage margin to the bit line capacitance CBL illustrating the operating characteristic of the cell array block 41 of FIG. 3.

The bit line capacitance CBL is determined by adding a bit line intrinsic capacitor Ci and a matching capacitor Cm. As a result, the cell capacitance of the cell storage capacitor FC becomes similar to the bit line capacitance CBL. As shown in FIG. 4, an operating area D is formed at a voltage level close to a target point T (optimum sensing margin voltage level). That is, the operating area D is formed at the optimum sensing voltage margin.

Figure 5:
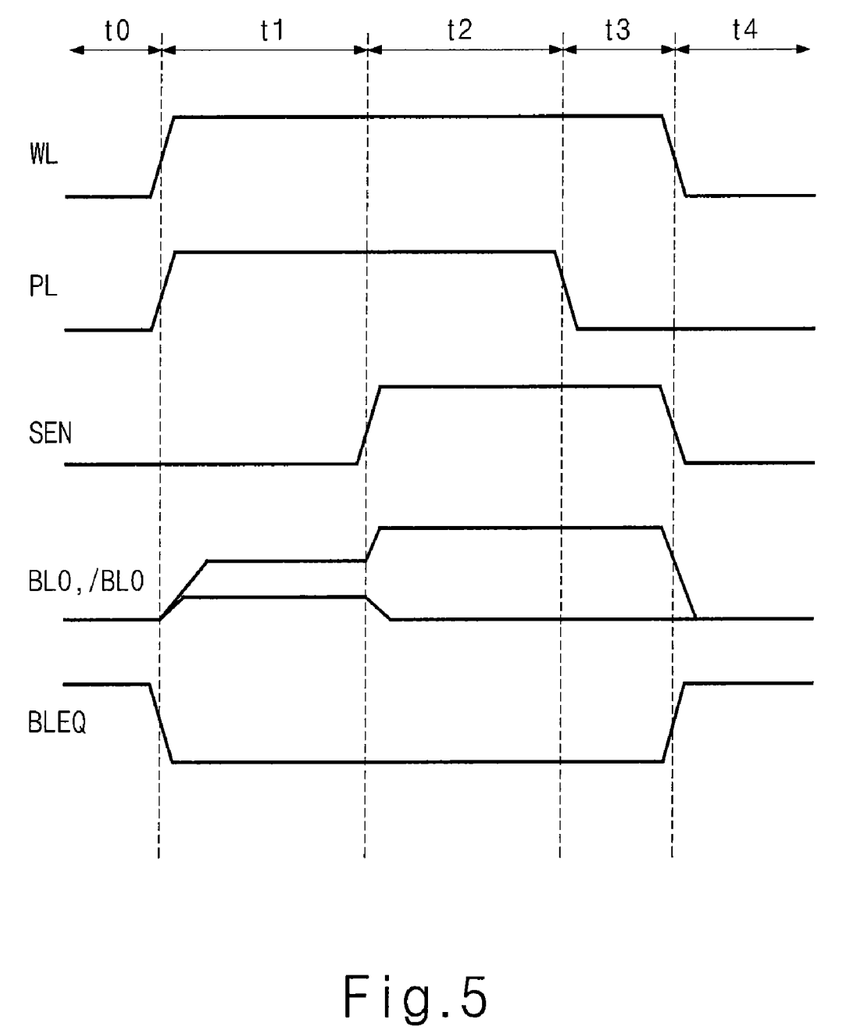
FIG. 5 is a timing diagram illustrating the operation of the cell array block of FIG. 3.

FIG. 5 is a timing diagram illustrating the operation of the cell array block 41 of FIG. 3.

In periods t0 and t4, the bit lines BL0 and /BL0 is precharged to the ground voltage level.

In a period t1, the bit line equalization signal BLEQ is deactivated, and the word line WL0 and the plate line PL0 are activated, so that data stored in the cell capacitor FC are loaded on the bit line BL0 by charge distribution to generate a voltage difference between the true bit line BL0 and the complementary /BL0.

In a period t2, the sense amplifier enable signal SEN is activated to amplify the voltage difference between the paired bit lines BL0 and /BL0. Here, low level data "0" is written.

In a period t3, the plate line PL0 is deactivated, so that high level data "1" is written.

Figure 6:
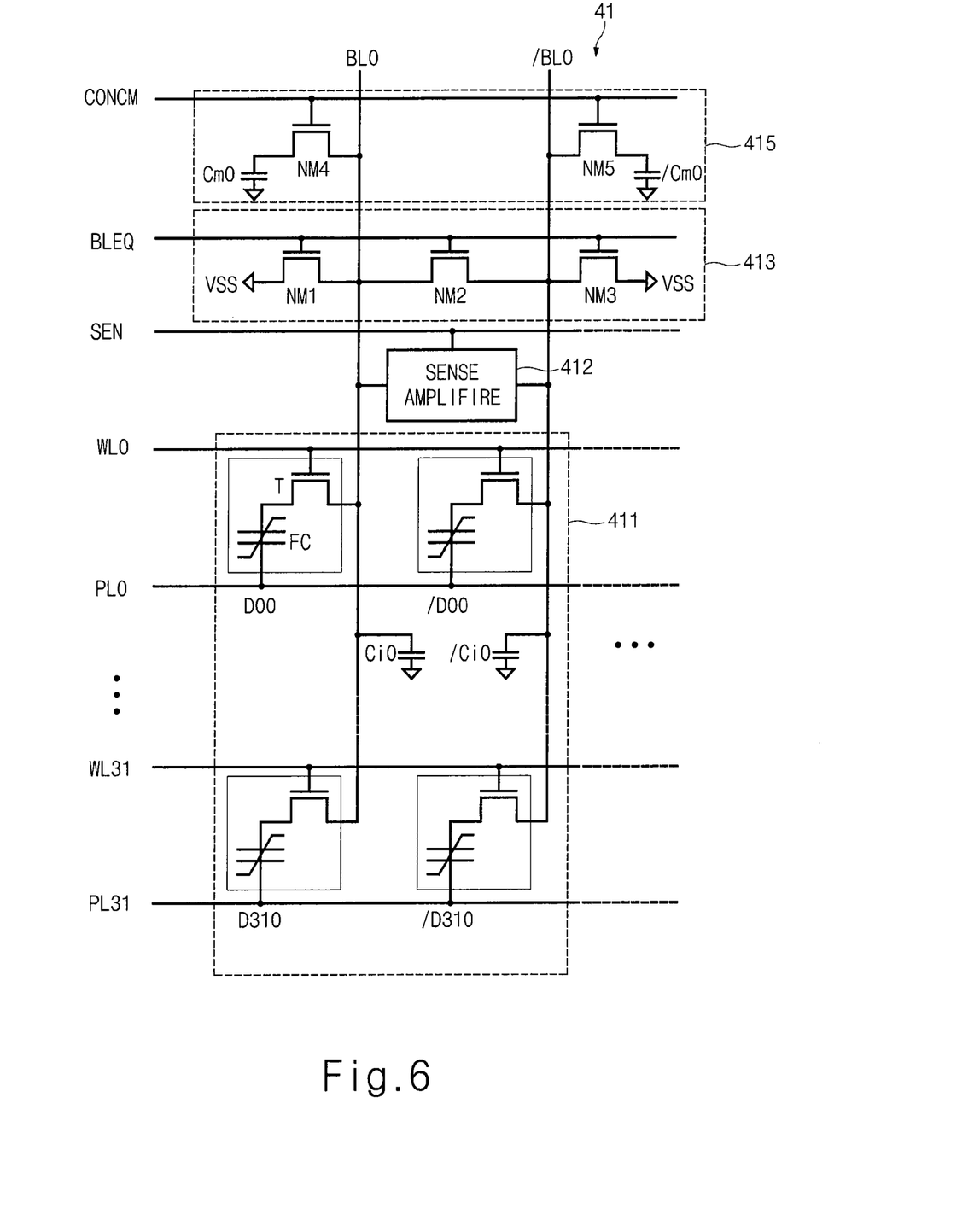
FIG. 6 is a circuit diagram illustrating the cell array block of FIG. 2 according to another embodiment of the present invention.

FIG. 6 is a circuit diagram illustrating the cell array block of FIG. 2 according to another embodiment of the present invention.

The cell array block 41 of FIG. 6 is different from the cell array block 41 of FIG. 3 in configuration of a bit line capacitance matching unit 415. Here, only the bit line capacitance matching unit 415 is specifically described.

The bit line capacitance matching unit 415 of FIG. 6 comprises a plurality of matching capacitors Cm0, /Cm0 and a plurality of matching control units N4, N5.

The matching control units N4, N5 are NMOS transistors controlled by a matching control signal CONCM to selectively connect the matching capacitors Cm0, /Cm0 to the paired bit lines BL0, /BL0.

When the matching control signal CONCM is activated to a high level to turn on the NMOS transistors NM4, NM5, the bit line capacitance CBL becomes addition of the intrinsic capacitor Ci and the matching capacitor Cm. The power consumption P in the bit line BL0 is represented by Equation 1.

$$P=(Cm+Ci)V^2 f \quad \text{[Equation 1]}$$

Referring to Equation 1, the power consumption P of the bit line is proportional to the bit line capacitance CBL, the operation frequency f and the square of the operating voltage V.

Meanwhile, when the matching control signal CONCM is deactivated to such a low level so as to turn off the NMOS transistors NM4, NM5, the bit line capacitance CBL is determined by the intrinsic capacitor Ci. Here, the power consumption P in the bit line is represented by Equation 2.

$$P=CiV^2 f \quad \text{[Equation 2]}$$

In another embodiment of the cell array block 41 of FIG. 6, the matching capacitors Cm0, /Cm0 are selectively connected to the paired bit lines. While cell data is charge-distributed in the bit line BL0, the matching capacitors Cm0, /Cm0 are connected to the paired bit lines BL0, /BL0 to increase the bit line capacitance CBL, thereby optimizing the sensing margin. While the data are amplified, the matching capacitors Cm0, /Cm0 are not connected to the paired bit lines BL0, /BL0 to decrease the bit line capacitance CBL, thereby reducing power consumption.

Figure 7:
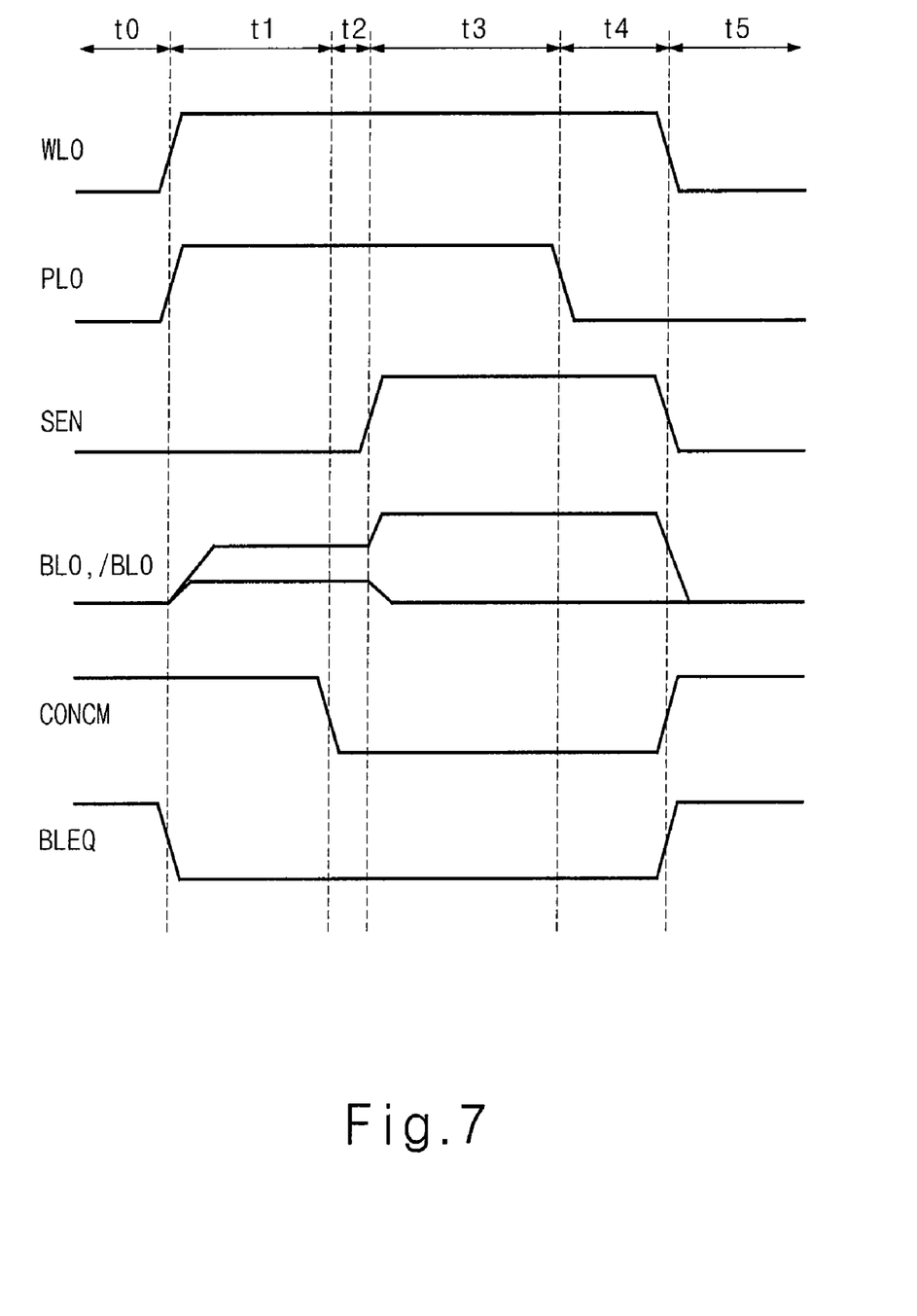
FIG. 7 is a timing diagram illustrating the operation of the cell array block of FIG. 6.

FIG. 7 is a timing diagram illustrating the operation of the cell array block 41 of FIG. 6.

In periods t0 and t5, the paired bit lines BL0, /BL0 are precharged to the ground voltage level.

In a period t1, the bit line equalization signal BLEQ is deactivated, and the word line WL0 and the plate line PL0 are activated, so that data stored in the cell capacitor FC is loaded on the bit line BL0 by charge distribution to generate a voltage difference between the true bit line BL0 and the complementary /BL0.

In a period t2, the matching control signal CONCM is deactivated so as to not connect the matching capacitors Cm0, /Cm0 to the paired bit lines BL, /BL0.

In a period t3, the sense amplifier enable signal SEN is activated to amplify a voltage difference between the paired bit lines BL0, /BL0. Here, low level data "0" is rewritten.

In a period t4, the plate line PL0 is deactivated, so that high level data "1" is rewritten.

As a result, in the periods t3 and t4 which are amplification periods having large power consumption, the power consumption P of the paired bit lines BL0, /BL0 is minimized like the Equation 2.

In this embodiment, the matching capacitors Cm0, /Cm0 are additionally connected at the read mode to increase the bit line capacitance CBL to be the same as capacitance of the cell capacitor FC, thereby optimizing the sensing margin. When the data on the true bit line BL0 is amplified, the matching capacitors Cm0, /Cm0 are separated from the paired bit lines BL0, /BL0 to minimize power consumption.

As described above, when data of a nonvolatile ferroelectric memory in a RFID device according to an embodiment of the present invention are read, bit line capacitance is regulated to optimize a sensing voltage margin, thereby optimizing the power consumption.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A RFID device having a memory comprising:
an analog block configured to transmit and receive a radio frequency signal to/from an external communication apparatus;
a digital block configured to receive a power voltage and the radio frequency signal from the analog block, to transmit a response signal to the analog block and to output a memory control signal; and
a memory including a bit line capacitance matching unit configured to regulate total capacitance of a bit line and a cell array block comprising a plurality of unit cells for storing data.

2. The RFID device according to claim 1, wherein the memory further comprises:
a word line decoder configured to decode an address to select a word line corresponding to the cell array block;
an output block configured to sense and amplify data on a selected bit line of the cell array block or to transmit externally inputted data to the cell array block; and
a control block configured to receive a chip enable signal, an output enable signal and a write enable signal to output a control signal for read/write operations to the word line decoder and the output block.

3. The RFID device according to claim 2, wherein the cell array block comprises:
a cell array configured to comprise the plurality of unit cells which are selected by the bit line, a word line and a plate line;
a plurality of sense amplifiers each configured to sense and amplify data on the bit line in response to a sense amplifier enable signal; and
a bit line equalization block configured to set the bit line at a predetermined voltage in response to a bit line equalization signal.

4. The RFID device according to claim 1, wherein the bit line capacitance matching unit includes a plurality of discharge units connected to the bit line.

5. The RFID device according to claim 4, wherein the bit line capacitance matching unit further comprises a switch configured to selectively connect the bit line to each of the plurality of discharge units respectively.

6. The RFID device according to claim 5, wherein the sum of capacitance of each of the plurality of discharge units and intrinsic capacitance of the bit line is set to be identical to capacitance of the respective unit cells.

7. The RFID device according to claim 2, wherein the unit cell comprises:
a ferroelectric cell capacitor configured to store data; and
a cell transistor configured to selectively connect the bit line to the ferroelectric cell capacitor depending on a voltage applied to the word line.

8. The RFID device according to claim 7, wherein the ferroelectric cell capacitor has a ferroelectric layer.

9. The RFID device according to claim 1, wherein the bit line capacitance matching unit regulates total capacitance of the bit line by summing an intrinsic capacitance of the bit line and a capacitance of the bit line capacitance matching unit.

* * * * *